United States Patent
Noguchi et al.

(10) Patent No.: US 6,483,176 B2
(45) Date of Patent: Nov. 19, 2002

(54) SEMICONDUCTOR WITH MULTILAYER WIRING STRUCTURE THAT OFFER HIGH SPEED PERFORMANCE

(75) Inventors: Mitsuhiro Noguchi; Akira Nishiyama, both of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/740,881

(22) Filed: Dec. 21, 2000

(65) Prior Publication Data

US 2001/0017418 A1 Aug. 30, 2001

(30) Foreign Application Priority Data

Dec. 22, 1999 (JP) .......................... 11-364199

(51) Int. Cl.$^7$ ............................. H01L 23/495
(52) U.S. Cl. ..................... 257/666; 257/211; 257/758; 257/773
(58) Field of Search ................. 257/666, 211, 257/758, 773, 752; 357/40, 45; 174/255

(56) References Cited

U.S. PATENT DOCUMENTS

| | | | |
|---|---|---|---|
| 5,060,045 A | * 10/1991 | Owada et al. | 357/45 |
| 5,631,478 A | * 5/1997 | Okumura | 257/211 |
| 5,633,479 A | * 5/1997 | Hirano | 174/255 |
| 5,834,845 A | * 11/1998 | Stolmeijer | 257/752 |

FOREIGN PATENT DOCUMENTS

| | | |
|---|---|---|
| JP | 6-13590 | 1/1994 |
| JP | 7-122554 | 5/1995 |
| JP | 8-335784 | 12/1996 |
| JP | 9-293843 | 11/1997 |
| JP | 10-27878 | 1/1998 |
| JP | 2000322462 | * 5/1999 ........... H01L/21/82 |

OTHER PUBLICATIONS overview of Interconnect (chapter 10) Handbook of semiconductor manufacturing technology by Nishi and Doering.*

* cited by examiner

Primary Examiner—David Nelms
Assistant Examiner—Thinh Nguyen
(74) Attorney, Agent, or Firm—Oblon, Spivak, McClelland, Maier & Neustadt, P.C.

(57) ABSTRACT

An electrical wiring structure capable of improving a wiring delay to thereby achieve both low power consumption and high-speed performances without accompanying any significant changes in circuit layout and wiring structure of prior known CMOS logic circuitry and also alterations of the multilayer configuration of wiring layers is provided. A local wiring 1 and global wirings 2, 3 are stacked over a semiconductor substrate 10 in this order of sequence when looked at from lower part in a lamination direction, with dielectric layers sandwiched between adjacent ones of these layers. A distance between the local wiring 1 and the global wiring 2 is so formed as to be greater than a distance between the global wiring layer 2 and the global wiring 3. Thus provided is a semiconductor device featured in that a drive voltage used to drive the global wirings 2, 3 is potentially lower than a drive voltage for driving inside of the local wiring 1.

20 Claims, 10 Drawing Sheets

US 6,483,176 B2

SEMICONDUCTOR WITH MULTILAYER WIRING STRUCTURE THAT OFFER HIGH SPEED PERFORMANCE

BACKGROUND OF THE INVENTION

1. Field of the Invention

The present invention relates generally to semiconductor devices and more particularly to semiconductor logic circuitry having a multilayer wiring structure offering high-speed performances while reducing electrical power consumed therein.

2. Description of the Related Art

Very-large-scale or ultralarge-scale semiconductor logic circuits formed of complementary metal oxide semiconductor (CMOS) transistors are such that semiconductor elements are becoming smaller in size or "shrinking" in minimum feature length. On the contrary, chip sizes are increasing year by year, so electrical interconnect wirings are longer.

As the wirings are longer, electrical resistivity and/or coupling capacitances of the wirings larger than channel resistivities and diffusion layer capacitances of those transistors used to drive the wirings. Thus, device operation speed will no longer be expectable even when semiconductor elements such as transistors are designed to offer enhanced speed performances. This can be because the operation speed of circuitry is determinable by such wirings, resistance and capacitance.

One typical approach to improving the circuit operation speed is to increase wirings thickness and/or width for reduction of their resistances. The approach results in widening a spacing or interval between adjacent wirings. The approach is not suitable for highly integrated logic circuits.

Currently available wirings structures for highly integrated logic circuits include a multilayered wiring structure that comprises a plurality of wirings layers on or over a semiconductor chip. This multilayer structure is typically designed to include two types of wirings layers that are insulatively stacked or laminated at different levels over a semiconductor chip with logic circuits formed thereon. One wiring is local wiring and the other is global wiring. The local wirings are formed in a lower-level layer for electrical interconnection between adjacent ones of the logic circuits on the semiconductor chip. The global wirings are in an upper-level layer for connection between spaced-part ones of the logic circuits (Japanese Patent Publication Unexamined Number 6-13590").

The logic circuits tend to increase in clock frequency in accordance with microfabrication scaling. Number of wirings in each wiring layer is required to increase in accordance with microfabrication scaling. So even with the above-noted multilayer wiring structure, it can increase in power consumption required for effectuation of capacitive charge-up/discharging at such wiring layer.

Accordingly, it remains difficult for the multilayer wiring structure to reduce the power consumption in wirings capacitance chargeup and discharge events while at the same time improving a wiring delay without having to increase the requisite number of wiring layers.

SUMMARY OF THE INVENTION

The present invention has been made to avoid the problems, and an object of the invention is to provide a semiconductor device capable of suppressing a wiring delay and achieving both low-power consumption and high-speed performances, without accompanying significant changes or modifications of circuit layout of CMOS logic circuitry and wiring structure.

To attain the foregoing object, in accordance with a first aspect of the present invention, a semiconductor device is provided which comprises:

a semiconductor device comprising:

a semiconductor substrate;

a semiconductor element formed on or over the semiconductor substrate, the semiconductor element substantially covered with a first insulating film;

a first wiring formed on the first insulating film, the first wiring electrically connected to the semiconductor element;

a second wiring formed over the first wiring with a second insulating film laid therebetween; and a third wiring formed over the second wiring with a third insulating film laid therebetween, wherein a thickness of the first wiring is less than a thickness of the second wiring and thickness of the third wiring, and a distance between the first wiring and the second wiring is greater than a distance between the second wiring and the third wiring.

At this time, it is preferred that the second wiring is formed adjacent and next to the first wiring in an up-down direction, and that the third wiring is formed adjacent and next to the second wiring in the up-down direction.

At this time, it is preferred that when the distance between the first wiring and the second wiring is represented by H1 while the distance between the second wiring and the third wiring is H2, these are given as $H1 \geq 1.7 \times H2$.

It is also preferred that a wiring pitch of the adjacent first wirings is less than a wiring pitch of the adjacent second wirings and a wiring pitch of the adjacent third wirings.

It is also preferred that a wiring width of the first wiring is less than a wiring width of the second wiring and a wiring width of the third wiring.

It is also preferred that the first wiring and the second wiring are in a relation of crossover layout.

It is also preferred that an amplitude of a signal voltage of the second wirings and an amplitude of a signal voltage of the third wirings are each less than an amplitude of a signal voltage of the first wirings.

It is also preferred that the amplitude of the signal voltage of the first wiring is equal to a difference between a power supply voltage of the semiconductor element $V_{DD}$ and a grand voltage.

It is also preferred that when the amplitude of the signal voltage of the second wiring is $V_1$, the distance between the first wiring and the second wiring is greater than $(V_{DD}/V_1)^{1.5}$ times of the distance between the second wiring and the third wiring.

It is also preferred that the first wiring is directly connected to the semiconductor element through a contact hole.

It is also preferred that the amplitude of the signal voltage of the second wirings is less than or equal to $0.48 V_{DD}$.

In addition, in accordance with a second aspect of the invention, a semiconductor device is provided which comprises:

a semiconductor device comprising:

a semiconductor substrate;

a semiconductor element formed on or over the semiconductor substrate, the semiconductor element substantially covered with a first insulating film;

a first wiring formed on the first insulating film, the first wiring electrically connecting to the semiconductor element;

a second wiring formed over the first wiring with a second insulating film laid therebetween;

a third wiring over the second wiring with a third insulating film laid therebetween; and a fourth wiring formed over the third wiring with a fourth insulating film laid therebetween, wherein a thickness of the first wiring is less than a thickness of the second wiring, the third wiring and the fourth wiring, and a distance between the first wiring and the second wiring is greater than a distance between the third wiring and the fourth wiring.

At this time, it is preferred that the second wiring is formed adjacent and next to the first wiring in an up-down direction, that the third wiring is formed adjacent and next to the second wiring in the up-down direction, and that the fourth wiring is formed adjacent and next to the third wiring in the up-down direction.

At this time, it is preferred that when the distance between the first wiring and the second wiring is represented by H1 while the distance between the third wiring and the fourth wiring is H2, $H1 \geq 1.7 \times H2$ is established.

It is also preferred that a wiring pitch of the adjacent first wirings is less than a wiring pitch of the adjacent second wirings and a wiring pitch of the adjacent third wirings.

It is also preferred that a wiring width of the first wiring is less than a wiring width of the second wiring and a wiring width of the third wiring.

It is also preferred that a wiring pitch of the adjacent first wirings is less than a wiring pitch of the adjacent fourth wirings.

It is also preferred that the first wiring and the second wiring are in a relation of crossover layout.

It is also preferred that an amplitude of a signal voltage of the second wirings, an amplitude of a signal voltage of the third wirings and an amplitude of a signal voltage of the fourth wirings are less than an amplitude of a signal voltage of the first wirings.

It is also preferably that the amplitude of the signal voltage of the first wiring is equal to a difference between a power supply voltage of the semiconductor element $V_{DD}$ and a grand voltage.

It is also preferred that the amplitude of the signal voltage of the second wiring is $V_1$, the distance between the first wiring and the second wiring is greater than $(V_{DD}/V_1)^{1.5}$ times of the distance between the third wiring and the fourth wiring.

It is also preferred that the first wiring is directly connected to the semiconductor element through a contact hole.

It is also preferred that 19. the amplitude of signal voltage of the second wirings is less than or equal to $0.48V_{DD}$.

In addition, with the present invention, the distance H1 between the first wiring (local wiring) and the second wiring (global wiring) becomes greater than the distance H2 between the second wiring and the third wiring to satisfy $H1>0.4H2 (V_{DD}/V_1)$, where $V_{DD}$ is an amplitude of a signal voltage of the local wirings, and $V_{DD}$ is equal to a difference between the power supply voltage of the semiconductor element and a grand, and $V_1$ is the amplitude of the signal voltage of global wirings formed of the second wiring and third wiring, $V_1$ being less than $V_{DD}$. That can prevent operation errors due to voltage interference in the global wiring from the local wiring with the amplitude of the signal voltage $V_{DD}$ by capacitive coupling.

Additionally, since the present invention makes it possible to reduce chargeup and discharging at the global wiring by letting the amplitude of the signal voltage at the global wiring be less than the amplitude of the signal voltage at the local wiring, it is possible to realize lower power consumption than ever before.

The present invention also provides a semiconductor device comprising:

a semiconductor device comprising:

a semiconductor substrate;

a semiconductor element formed on or over the semiconductor substrate, the semiconductor element covered with a first insulating film;

a local wiring formed on the first insulating film, the local wiring electrically connecting to the semiconductor element, the local wiring including a first wiring;

a global wiring formed over the local wiring with a second insulating film laid therebetween, the global wiring electrically connected to the local wiring, the global wiring including a second wiring and a third wiring formed over the second wiring, wherein a thickness of the first wiring is less than a thickness of the second wiring and a thickness of the third wiring, and a distance between the first wiring and the second wiring is greater than a distance between the second wiring and the third wiring.

DETAILED DESCRIPTION OF THE INVENTION

Preferred embodiments of the present invention are set forth with reference to the accompanying drawings below.

Embodiment 1

Figure 1:
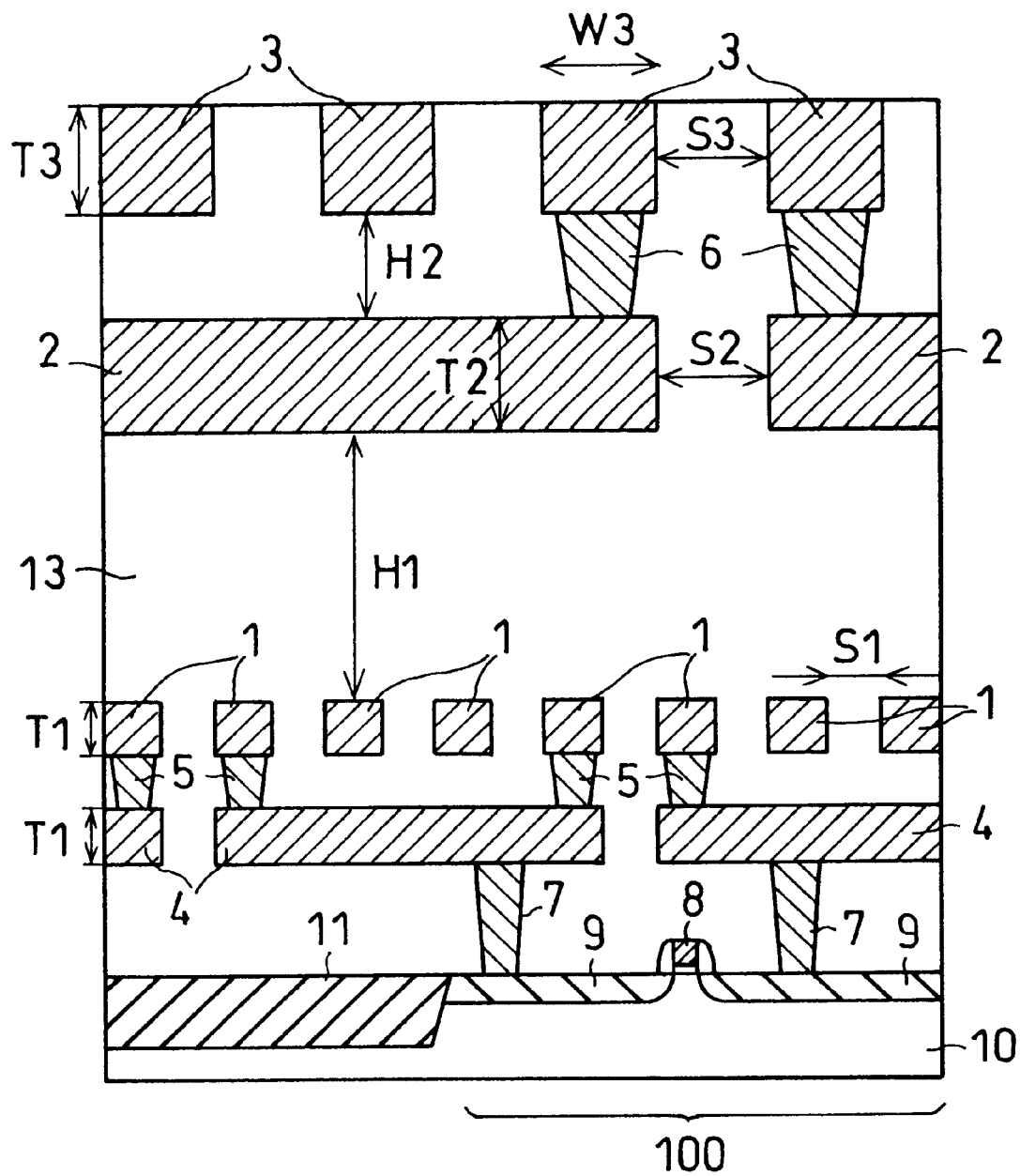
FIG. 1 is a diagram showing a cross-sectional view of a semiconductor device in accordance with a first embodiment of the present invention.
Figure 4:
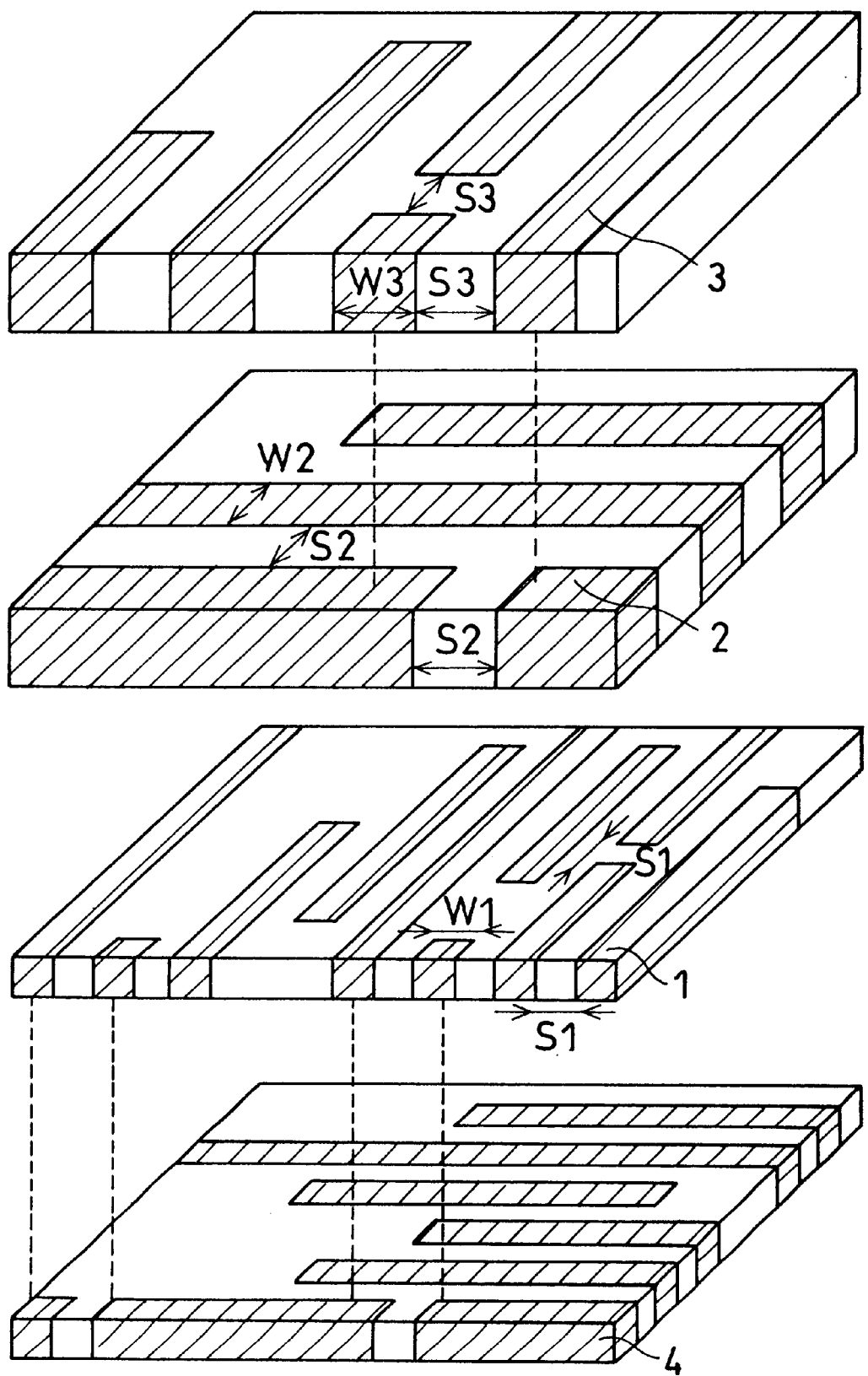
FIG. 4 is a diagram showing a plan view of the semiconductor device in accordance with the first embodiment of the present invention.

FIG. 1 is a diagram illustrating, in cross-section, a semiconductor device in accordance with a first embodiment of the present invention. In FIG. 4, an exploded perspective view of an internal structure of the device shown in FIG. 1, including planar layout patterns of respective wirings stacked or laminated over one another. In FIG. 4, for the purpose of visually emphasizing the wirings of interest, depiction of a semiconductor substrate region and contacts is eliminated, and dotted lines indicate the connection relationship between such contacts and interconnect wirings.

In the embodiment 1, the wirings are divided into two groups: "local" wirings (wiring 4 and first wiring 1), and "global" wirings (second wiring 2 and third wiring 3) as formed over the local wirings. A distance between global wiring (the second wiring 2) and local wiring (the first wiring 1) is designed to be wider than a distance between the global wirings (the second wiring 2 and the third wiring 3). A wiring thickness of global wiring (the second wiring 2 and the third wiring 3) is greater than a wiring thickness of local wiring layer (the wiring 4 and the first wiring 1). An amplitude of a signal voltage of the global wirings (the second wiring 2 and the third wiring 3) is lower than an amplitude of a signal voltage of the local wirings (the wiring 4 and the first wiring 1).

In this invention, "an amplitude of a signal voltage" of wirings means the voltage difference between two voltages that correspond to two logical states at steady states, respectively. For example, the two logical states correspond to "1" and "2".

The wiring 1 is the first wiring layer; the wiring layer 2 is the second wiring layer; and, the wiring layer 3 is the third wiring layer. In addition, the wiring 4 is formed to underlie the first wiring 1 for functioning as a local wiring together. A more detailed explanation is given below.

As shown in FIG. 1, a semiconductor substrate 10 is formed of a p-type semiconductor, which is made of silicon with a chosen impurity—e.g. boron or indium—doped therein to a concentration of about $10^{14}$ to $10^{18}$ atoms per square centimeter ($cm^{-3}$)

Formed on this p-type semiconductor substrate 10 are metal insulator semiconductor field effect transistors (MISFETs), each of which consists essentially of source and drain regions 9, a channel region defined between these source and drain regions 9, and a gate electrode 8 insulatively formed over this channel region with a gate insulating film sandwiched therebetween. These MISFETs make up a semiconductor logic circuit 100.

The MISFETs include more than one n-type MISFET. The n-type MISFET has a channel that is formed of a p-type impurity-doped region at a concentration of $10^{19}$ $cm^{-3}$ or less. The n-MISFET also has a gate insulating film formed of a silicon oxide film or silicon nitride film with a film thickness of 10 nanometers (nm) or less, and a polycrystalline silicon or "polysilicon" gate electrode 8 formed on this gate insulating film. The gate electrode 8 is doped with phosphorus (P) or arsenide (As) to an impurity concentration of $10^{19}$ $cm^{-3}$ or greater. The n-MISFET further includes source and drain regions 9 formed on the both sides of this gate electrode 8. The source and drain regions 9 are formed of n-type semiconductor regions with P and As doped thereinto to a concentration of $10^{19} cm^{-3}$ or more. The source and drain regions 9 measure 0.5 micrometers ($\mu m$) or less in depth. In addition, more than one p-type MISFET is also formed on the semiconductor substrate 10 in a similar manner to the n-MISFET, for forming together with the n-MISFET a switch element of complementary semiconductor logic circuitry.

The semiconductor substrate 10 has its surface portion on which these n- and p-MISFETs are not formed, on which portion an element separation region 11 formed of a silicon oxide film is fabricated to have a depth of 0.05 to 1 $\mu m$, for electrical isolation between adjacent ones of the individual MISFETs 100.

The wiring 4 is formed over these MISFETs making up the logic circuit, with an interlayer insulating film 13 (a first insulating film) sandwiched therebetween. The first wiring 1 is formed over the wiring 4 with an interlayer insulating film 13 sandwiched between them. The wiring 4 and first wiring 1 constitute local wirings. The second wiring 2 is formed over the first wiring 1 with an interlayer insulating film 13 (a second insulating film) laid therebetween. The third wiring 3 is formed over the second wiring 2 with an interlayer insulating film 13 (a third insulating film) laid therebetween. The second wiring 2 and third wiring 3 constitute global wirings. The interlayer insulating films 13 are formed, for example, of silicon oxide films or silicon nitride films, which are also formed between adjacent ones of the wiring 4, first wiring layer 1, second wiring layer 2, and third wiring layer 3.

It should be noted here that the local wirings are electrically interconnecting to the transistors constituting the semiconductor logic circuit 100 on the semiconductor substrate 10. Also note that in case that there are two or more wiring layers connecting to the transistors constituting the semiconductor logic circuit 100, the local wirings apply two wirings from the lowest wiring layer in the present invention. The global wirings are formed over these local wirings. The global wirings are connected to the first wiring layer 1 which is one of the local wiring layers. In the case that there are two or more wiring layers connected to the local wirings, the global wirings apply two wirings from the most upper wiring layer in the present invention. The present invention applies to at least one local wiring layer and at least two global wiring layers. Use of such arrangement with both the local wiring layers and the global wiring layers being formed of a lamination of at least two layers is for using one of the two layers as on-chip interconnect wirings extending in a direction "X" while using the remaining layer as those extending in a direction "Y" at right angles to the X direction by way of example, to thereby enable interconnection among any given elements and wirings on or over the substrate. In the present invention, the distance between local wiring and global wiring is the distance between the most upper wiring layer of the local wirings and lowest wiring layer of the global wirings.

Note that the term "interconnect wirings" or "wirings" as used herein may refer to electrical wires used for transmission of electrical signals of semiconductor logic circuitry. Respective wiring layers 1, 2, 3, 4 may be made of a chosen conductive material such as tungsten (W), copper (Cu), aluminum (Al), or AlCu.

In addition, wiring contacts 7 are formed on the source and drain regions 9 of the illustrative MISFET on the semiconductor substrate 10, and are connected to the wiring 4 of the local wirings. These wiring contacts 7 are made of W, Ru, TaN, Ti, TiN, Cu, Al, or AlCu with a height of 0.1 to 2 μm and a diameter of 0.03 to 1 μm.

A wiring width of the wiring 4 is such that minimizing a positional deviation or misalignment with the MISFETs formed on the semiconductor substrate 10 permits the contacts 7 to be formed to have a reduced diameter. In this way, the MISFETs are improved in integration density. Contacts 5, 6 at the wirings 1, 2, 3 placed in upper levels than the wiring 4 may be greater in diameter the contacts 7.

As previously stated, interconnect wirings of the wiring 4 are for use as relatively short wirings for connection between neighboring semiconductor logic circuits, and thus the layer is a local wiring for improvement of the integration density. Accordingly, in order to improve the integration density, it is preferred that the minimum line width of such wiring 4 fall within a range of from 0.03 to 1 μm and that the minimum wiring spacing or interval also range from 0.03 to 1 μm in the same manner as the wiring width.

Wiring contacts 5 are formed on the wiring 4, and are connected to the first wiring 1 which is another local wiring.

These wiring contacts 5 are made of W, Ru, TaN, Ti, TiN, Cu, Al, or AlCu with a height of 0.03 to 1 μm and a diameter of 0.03 to 1 μm. It is desirable in order to reduce electrical resistivities of contact portions of the first wiring 1 that the diameter of these wiring contacts 5 be specifically set so that it is equal to or greater than the diameter of wiring contacts 7.

Letting the first wiring 1 extend in a specified direction perpendicular to the wiring 4 makes it possible to freely rail an appropriate pattern of on-chip wirings for connection among those semiconductor logic circuit regions 100 that are disposed at random positions on the semiconductor substrate 10. In order to make equivalent minimal layout widths of semiconductor logic circuits 100 in a two-dimensional direction parallel to a multilayer plane of wirings thereby facilitating circuit layout, and also to improve the resulting integration density of such wirings, it is desirable that the first wiring 1 is formed to have the same wiring thickness and wiring width as those of the wiring layer 4.

The interlayer insulating film 13 (the second insulating film) is deposited on an entire surface of the first wiring 1 to have a specified height H1, with the second wiring 2 being formed on the insulating film 13. The interlayer insulating film 13 (the third insulating film) is deposited on an entire surface of the second wiring 2 to have a height H2, with the third wiring 3 formed thereon. Both the second wiring 2 and the third wiring 3 constitute global wirings. The global wirings perform wiring at relatively longer positions than local wirings. Additionally, the second wiring 2 and the third wiring 3 extend in perpendicular directions for given wiring of the randomly disposed semiconductor logic circuits 100 and local wirings.

Wiring contacts 6 are formed on the second wiring 2 and are connected to the third wiring 3. These wiring contacts 6 are designed to have the height H2 and diameter of 0.05 to 3 μm, and are made of W, Ru, Ti, TiN, TaN, Cu, Al, or AlCu with a diameter being equal to or greater than the diameter of wiring contacts 5.

Note that although not specifically shown in FIGS. 1 and 4, wiring contacts with the height H1 and diameter of 0.05 to 3 μm made of W, Ru, TaN, Ti, TiN, Cu, Al, or AlCu are formed between specified local wiring and global wiring— i.e. between the first wiring 1 and the second wiring 2, wherein these wirings are mutually connected together.

To reduce crosstalk between the local wiring and the global wiring, it is desirable that the first wiring 1 and the second wiring 2 are formed to extend in perpendicular directions rather than in parallel directions.

With the present invention, a wiring thickness T1 of the first wiring 1 and the wiring 4 for use as the local wirings is specifically formed so that it is less than a wiring thickness T2 of the second wiring 2 for use as the global wiring and a wiring thickness T3 of the third wiring 3 (T1<T2, T3). In addition, the distance H1 between the local wiring and the global wiring, i.e. the distance H1 between the first wiring 1 and the second wiring 2, is set greater than the distance H2 between the second wiring 2 and the third wiring 3 within the global wirings (H1>H2). Further, wiring pitch S2, S3 of the second wirings 2 and the third wirings 3 within the global wirings are so formed as to be greater than a wiring pitch S1 of the first wirings 1 and wirings 4 serving as the local wirings (S1<S2, S3). In this case, wiring pitch means the minimal wiring pitch in the wiring layer.

Furthermore, minimal wiring width W2, W3 of the second wirings 2 and the third wirings 3 for use as the global wirings are formed to be greater than a minimal wiring width W1 of local wirings (W1<W2, W3).

As the interconnect wiring resistivity per unit length at the global wirings is made lower in this way resulting in a further decrease in wiring capacitance, it becomes possible to lessen the product of wiring resistivity and wiring capacitance within the global wirings to thereby reduce the amount of charge-up and discharging increasable with an increase in clock speed, thus enabling achievement of low power consumption. Practically, doubling the wiring width results in the resistivity being half reduced in value. Doubling the wiring layer interval results in the capacitance being half reduced. Doubling the wiring spacing results in the capacitance being half reduced. Doubling the wiring film thickness results in the resistivity being half reduced.

Additionally, in cases where the wirings 1, 2, 3, 4 are made of certain material such as Al or Cu whereas the interlayer insulating films 13 are of electrically insulating or dielectric material with its relative dielectric constant of 4 or less, with a structure having a layout while optimizing a delay time due to the wirings and simultaneously. improving the wirings' integration density, the wiring structure is optimized within ranges of 0.2×S2<W2<5×S2, 0.2× S2<T2<5×S2, 0.2×S3<W3<5×S3, and 0.2×S3<T3<5×S3.

In addition, since the distance H1 between the first wiring 1 and the second wiring 2 is greater than the distance H2 between the second wiring 2 and the third wiring 3 (H1>H2), it is possible to prevent any capacitive coupling between the first wiring 1 and the second wiring 2, which in turn makes it possible to preclude occurrence of crosstalk noises at the second wiring 2.

Figure 2:
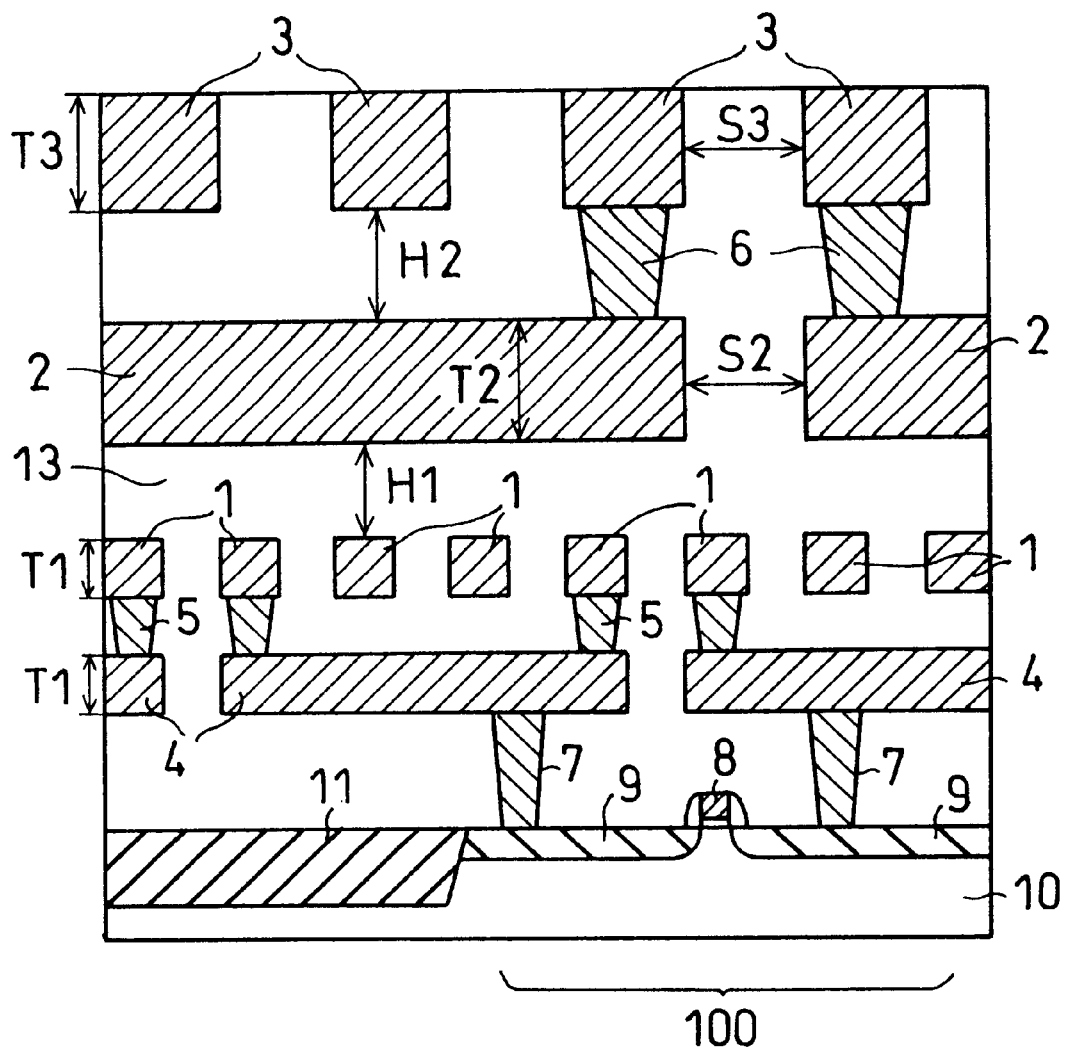
FIG. 2 is a diagram showing a sectional view of a semiconductor device of one comparative example.

See FIG. 2, which is a diagram showing the multilayer wiring structure for use as a comparative example in case the distance H1 between the first wiring 1 and the second wiring 2 is less than the distance H2 between the second wiring 2 and the third wiring 3 (H1<H2). The remaining parts of the structure of the comparative example are similar in structure to those shown in FIG. 1.

Even in this structure of the comparative example, in order to reduce the wiring resistivity per unit area of global wirings, the wiring thickness T2 of the second wiring 2 is set greater than the wiring thickness T1 of the first wiring 1 (T1<T2). Additionally, to reduce the capacitance between interconnect wirings within the global wirings, the minimum wiring pitch within such wirings is made equal or greater when becoming an upper layer structure. In addition, letting the interval or spacing between respective ones of the wirings 1, 2, 3, 4 be greater than the minimum wiring pitch within respective wirings 1, 2, 3, 4 permits reduction of an inherent capacitance between the wirings.

However, with this structure, crosstalk has undesirably occurred at the second wiring 2 due to capacitive coupling between the first wiring 1 and the second wiring 2. This structure suffers from the voltage noises interfered from the first wiring 1 in case where the signal voltage of the second wiring 2 and the third wiring 3 serving are reduced, thus making it difficult to correctly transfer electrical signals.

Figure 3:
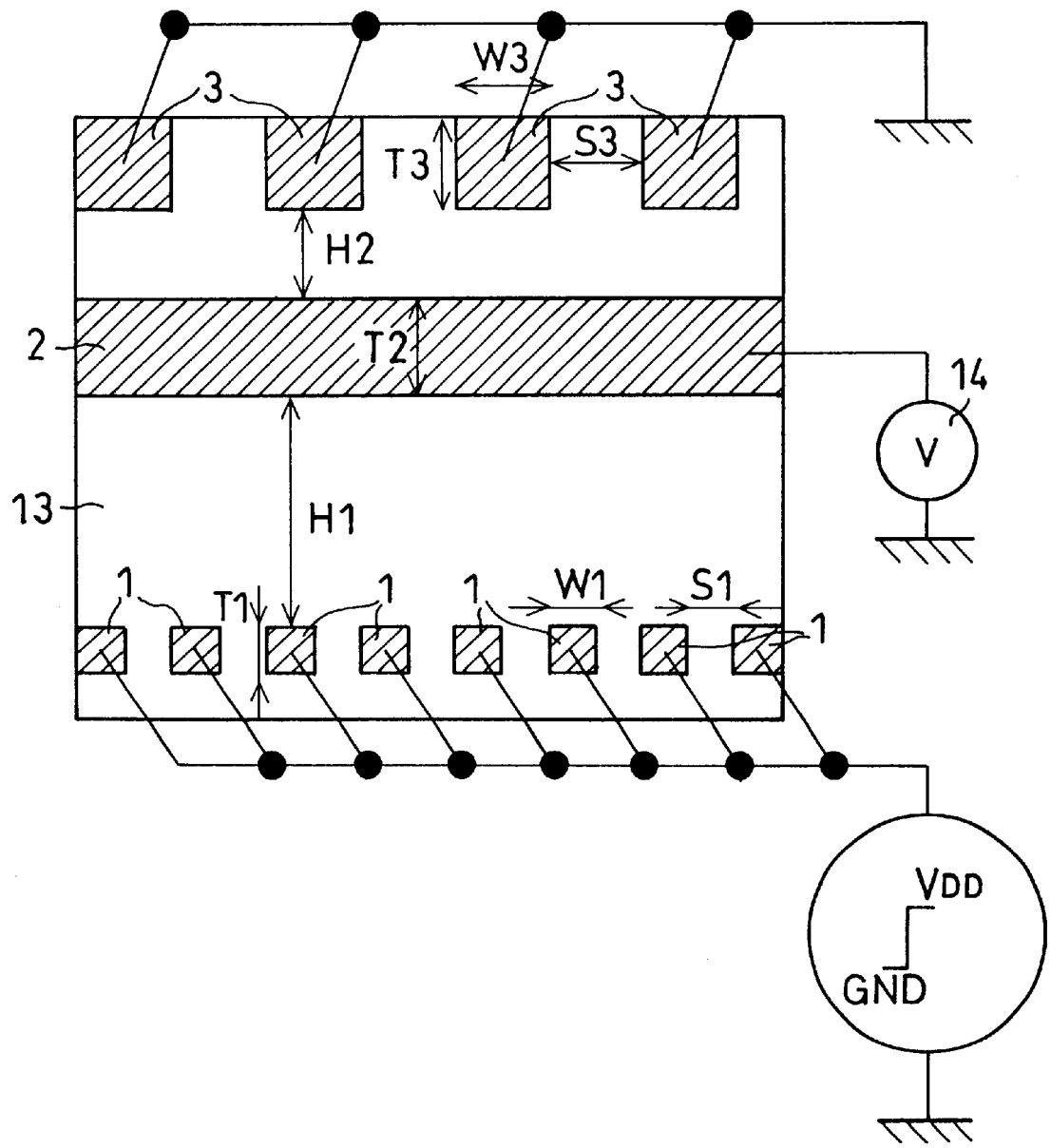
FIG. 3 is a sectional view diagram for explanation of a driving method of the semiconductor device in accordance with the first embodiment of the present invention.

FIG. 3 is a diagram for explanation of a method for driving the multilayer wiring structure of the present invention, which is for explaining an increase or riseup of a voltage of the second wiring 2 due to voltage pulses of the first wiring 1. It shows a structure overlying the first wiring 1 of FIG. 1.

Here, the first wiring 1 and the third wiring 3 are formed in a direction perpendicular to the second wiring 2, in order to minimize crosstalk. In addition, the first wiring 1 is formed densely to have a wiring thickness T1 and wiring width W1 plus wiring spacing S1, wiring pitch (W1+S1) to which step-like pulses are applied. Suppose that each pulse is potentially set at ground (GND) level before a prespecified time point and then goes to $V_{DD}$ level after a specified time point.

This is equivalent to the case of FIG. 4 where all the interconnect wirings within the first wiring 1 are railed beneath the second wiring 2 while letting logic circuits operable with the amplitude of the signal voltage of $V_{DD}$ be driven simultaneously in such a way that the amplitude of the signal voltage becomes $V_{DD}$. Additionally the third wiring 3 is formed densely with a wiring thickness T3, wiring width W3, wiring spacing S3, and wiring pitch (W3+S3), wherein each wiring is coupled to ground. The second wiring layer 2 is dense-formed with a wiring thickness T2 and wiring width W2, wiring spacing S2, and wiring pitch (W2+S2), wherein one wiring is in the potentially floating state, a voltage meter 14 is connected to one end, and the remaining wirings other than the one wiring are all grounded.

In FIG. 3, when a step pulse of from 0V to $V_{DD}$ is first applied to the first wiring 1, a signal voltage of the second wiring 2 increases by ΔV due to capacitive coupling. Here, it has been newly found by the inventor as named herein that $\Delta V/V_{DD}$ is identical to a value obtainable by the following formula:

$$\Delta V/V_{DD}=[\{0.0261-0.0945(T2/S2)\}(H2/S2)+0.3657-0.0541(T2/S2)]\times(H1/S2)^{-\{0.65+0.05(T2/S2)\}} \quad (1)$$

where, $1 \leq (H1/S2) \leq 3, 0.5 \leq (T2/S2) \leq 3, \frac{1}{4} \leq (S1/S2) \leq \frac{1}{2}$. Note that Equation (1) is obtained within an error range of ±20% when $W1 \leq 2 \times T1$, $W3 \leq 2 \times T3$.

Consider here that the second wiring 2 and the third wiring 3 are formed to have the same wiring width, wiring thickness and wiring spacing. When letting H1=H2 under the condition of H2=T2=S2, $\Delta V/V_{DD}$=0.24 is obtained from Equation (1), which would result in creation of a voltage riseup of $\Delta V$=0.24$V_{DD}$ at wiring 2 due to the capacitive coupling.

Alternatively, in case a signal being given to the first wiring 1 is a step pulse of from $V_{DD}$ to 0V, a voltage drop of –0.24$V_{DD}$ will take place at the second wiring 2.

Hence, as the amplitude of the signal voltage of the second wiring layer 2, $2 \times 0.24V_{DD}$=0.48$V_{DD}$ should be required in minimum. An erroneous operation must occur when letting the amplitude of the signal voltage of the second wiring 2 offer a small amplitude of the signal voltage with a voltage less than this voltage.

To avoid this, let H1 be greater than H2 especially, let the amplitude of the signal voltage of the second wiring layer 2 satisfy $V_1<V_{DD}$, thereby establishing $H1>(V_{DD}/V_1)^{1.5} \times H2$. With this value setting, from Equation (1), $\Delta V/V_{DD} \leq 0.24 \times (V_1/V_{DD})$ is obtained at least within a range of $0.5 \leq (T2/S2) \leq 3$, when compared to the case of H1=H2 with S1 and T2 being under the same condition.

Hence, with the present invention, it is possible to reduce the voltage riseup due to capacitive coupling from 0.24$V_{DD}$ to 0.24$V_1$ or below, which in turn makes it possible to suppress crosstalk to less than or equal to $(V_1/V_{DD})$ times when compared to the comparative example. Very importantly, the crosstalk suppressibility to less than or equal to $(V_1/V_{DD})$ times similarly is established even for arbitrary wiring layout with the first wiring 1 being changed from FIG. 3 layout in wiring width and wiring pitch.

As noted above, by specifically designing the amplitude of the signal voltage at minimal wiring pitch within the second wiring 2 and the third wiring 3 for use as the global wirings so that it is less than or equal to $V_1$, it is possible to suppress a crosstalk voltage of neighboring wirings within the second wirings 2 to the extent of less than or equal to $(V_1/V_{DD})$ times when compared to the case where the amplitude of the signal voltage of the wirings within the layers is set at $V_{DD}$ or less.

With these methods, it is no longer required to change the wiring line width and wiring pitch values of the second wiring 2 and the third wiring 3 and also the distance between the second wiring 2 and the third wiring 3.

With use of them in combination, in the present invention, it is possible to suppress all the crosstalk voltages due to capacitive coupling of the second wiring 2 and the third wiring 3 to less than or equal to $(V_1/V_{DD})$ times when compared to the case where those wirings included in the second wiring 2 and the third wiring 3 of the comparative example are driven with the $V_{DD}$ amplitude of the signal voltage. With this method, it is possible to suppress the amplitude of the signal voltage of those of the on-chip wirings which are included in the second wiring 2 and the third wiring 3 to less than or equal to $(V_1/V_{DD})$ times that of the comparative example.

In addition, using the same idea to other wirings overlying the third wiring 3 makes it possible for such upper-level wirings to suppress the amplitude of the signal voltage to less than or equal to $(V_1/V_{DD})$ times.

It should be noted in the arrangement of FIG. 1 that in case the amplitude of the signal voltage of the third wiring 3 is set for example at $V_{DD}$ whereas the amplitude of the signal voltage of the second wiring 2 is set for example at $V_1$ which is potentially lower than $V_{DD}$, a receiver of the second wiring 2 can malfunction and, thus, any intended effects no longer is obtainable. Such malfunction occurs due to the fact that the crosstalk voltage affected from the third wiring 3 to the second wiring 2 measures about ±0.24$V_{DD}$ when the distance between the second wiring 2 and the third wiring 3 is simply kept at H2, which is narrower than H1. Hence, sufficient effects are obtainable by suppressing the amplitude of the signal voltage of the third wiring 3 opposing the second wiring 2.

In many cases, an external input/output terminal to which the amplitude of the signal voltage of $V_{DD}$ is applied is typically provided at the second wiring 2 and the third wiring 3 serving as the global wirings and more than one wiring overlying them. The crosstalk that be affected from the amplitude of the signal voltage of $V_{DD}$ to the smaller amplitude of the signal voltage than $V_{DD}$ of the wirings may be reduced by use of a wiring structure shown in FIG. 5, by way of example.

Figure 5:
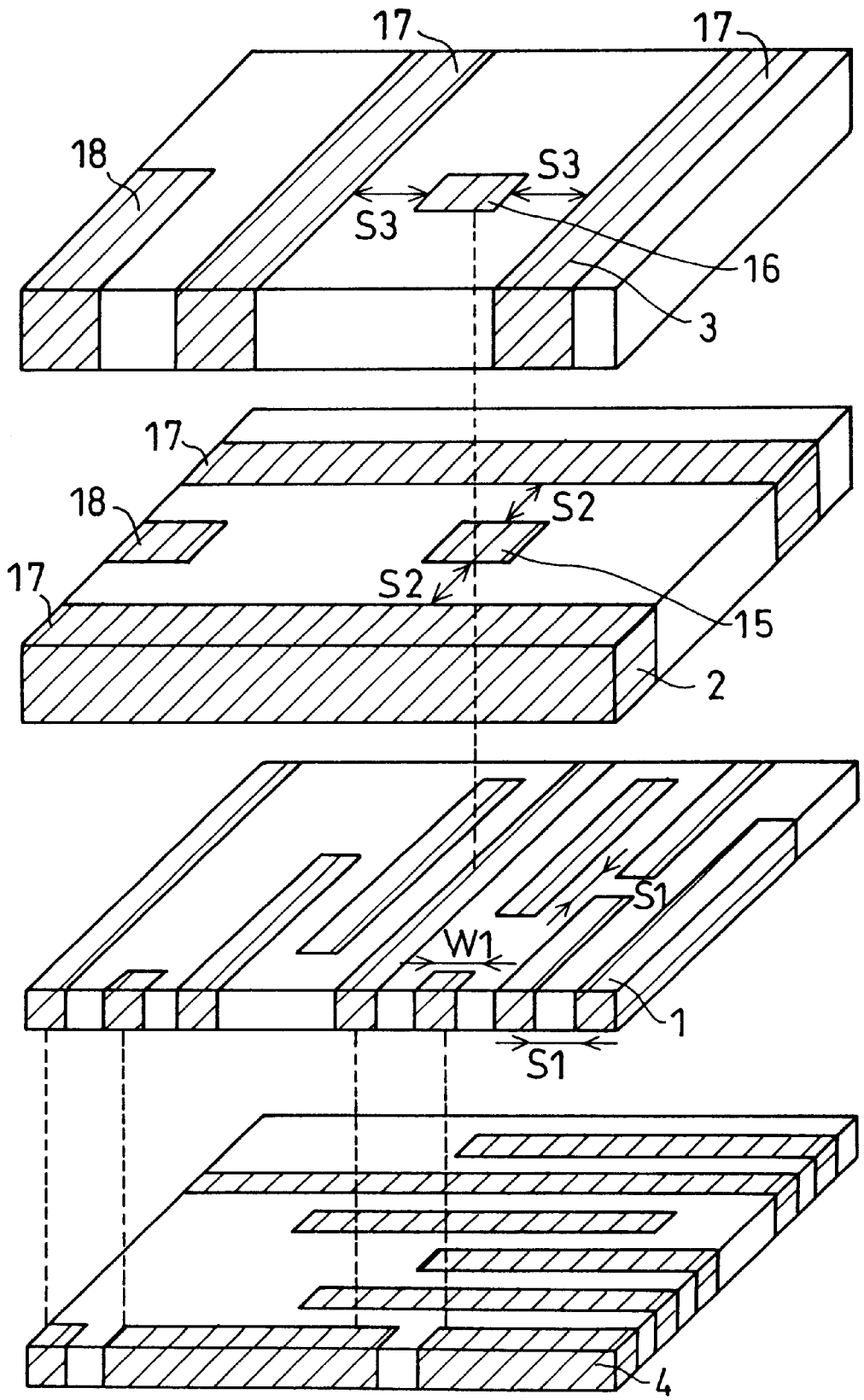
FIG. 5 is a diagram showing a plan view of the semiconductor device in accordance with the first embodiment of the present invention.

FIG. 5 is a diagram showing an exploded perspective view of lamination layers of a signal wiring structure with the amplitude of the signal voltage of $V_{DD}$ penetrating the second wiring 2 and the third wiring 3. A duplicative explanation of those parts or components denoted by the same reference characters as those used in FIG. 4 is eliminated herein.

Interconnect wirings subjected to the $V_{DD}$ amplitude of the signal voltage at the second wiring 2 and the third wiring 3 are a wiring 15 and a wiring 16, which are connected to an underlying input circuit and output circuit, and to a further over lying wiring (not shown in the drawing). These input circuit and output circuit with respect to the outside may typically be formed of elements that are disposed in very close proximity to one another, and onchip wirings are sufficiently realizable by using a local wiring or wirings.

Accordingly, the wiring 15 and wiring 16 penetrating the second wiring 2 and the third wiring 3 may be designed to have a minimal area which is small enough to permit fabrication of contacts wiring to further overlying wirings as shown in FIG. 5. Hence, the capacitive coupling to neighboring wirings within the second wiring 2 or the third wiring 3 can also be lessened due to smallness in sectional area of the wirings 15, 16. This results in capability of retaining crosstalk minimally in a way substantially proportional to the wiring sectional area, when compared to the case where the wirings 15, 16 are formed so that these extend in parallel within global wirings to have increased lengths.

Note in FIG. 5 that wirings 17 having constant potential levels such as for example GND and $V_{DD}$ or the like are formed adjacent to the wiring 15 and wiring 16 to thereby shield these wirings 15, 16. Desirably an in-place distance between a wiring 17 and any one of the wirings 15, 16 is formed to become a minimal wiring pitch.

In addition, it has been found through experimentation that as far as a spacing or interval between the wiring 16 and wiring 18 is kept constant, the wirings 17 included in the same layer as the wiring 16 for example are capable of reducing crosstalk occurring due to capacitive coupling of the wiring 16 toward a small amplitude of the signal voltage of the wiring 18 within the same layer to less than 1/10 of crosstalk occurring in case the wirings 17 are absent, which in turn makes it possible to reduce crosstalk while simultaneously permitting fabrication of dense wirings.

Similarly, the wirings 17 included in the same layer as the wiring 15 permits reduction of crosstalk occurring due to capacitive coupling from the wiring 16 toward the small amplitude of the signal voltage of the wiring 18 within the same layer, when the interval relative to the wiring 18 is kept constant. In this case, it has been affirmed that letting the distance between wiring 15 and wiring 18 be "k" times greater than the minimum wiring pitch S2 of the wiring layer 2 makes it possible to reduce crosstalk occurring at the wiring 18 to less than (1/k) times of the case of a layout with the minimum wiring pitch.

By use of the above method, it is possible to reduce crosstalk with respect to the small amplitude of the signal voltage of the wiring from a signal terminal of the $V_{DD}$ amplitude of the signal voltage.

A typical number of external input/output terminals is no more than $1.9 \times N^{0.5}$ [lines] even in gate arrays, where "N" is the number of transistor gates, when compared to the number of transistors. In this connection, among currently available microprocessors, static random-access memories (RAMs), dynamic RAMs and gate arrays, the gate arrays have the largest number of external input/output terminals with respect to a gate number. In this case, as compared to the total number of wirings on a chip using transistors which nearly equals $3 \times N$, it is less than or equal to 0.07% when the transistor number is of $10^6$ pieces or more, wherein a ratio thereof to all wirings decreases at $N^{-0.5}$ with an increase in transistor number.

Note here that the wiring area of a global wiring due to the bit-line shielding method of FIG. 5 is expected to increase by a degree of no more than about four times when compared to the wiring area in the case of eliminating the bitline shielding-such wirings occupy a reduced area of $36F^2$ or more or less, where the minimum wiring pitch of the second wiring 2 is represented as "2F." Hence, when setting the wiring pitch at 2 μm for example, the resultant increase in area due to the bitline shield shown in FIG. 5 would approximately measure $36F^2 \times (4-1)$ times, which is nearly equal to 100 μm². Even in total of all the input/output pins involved, it is less in area than $10^6$ pieces×0.07%×100 μm²~0.07 mm². With most VLSI circuit chips of 10 mm² or greater, a ratio of chip area increase is very small.

Further, in order to reduce crosstalk with respect to a small amplitude of the signal voltage of the wiring from the $V_{DD}$ amplitude of the signal voltage of the signal terminals, the same layout as that shown in FIG. 5 is also employable for the first wiring 1 and the wiring 4 even where the small amplitude of the signal voltage is to be transferred to the second wiring 2 and the third wiring 3 through the first wiring 1 and the wiring 4 of the amplitude of the signal voltage of $V_{DD}$.

Since this small amplitude of the signal voltage of the wiring is not required to be connected with any other first wiring 1 and the wiring 4 of the amplitude of the signal voltage of $V_{DD}$, it is possible to form it into a rectangular shape with a sectional wiring area being kept minimized within the first wiring 1 and the wiring 4 in a similar manner to the wiring 15 and wiring 16 of FIG. 5.

Hence, it is possible to get smaller interference noise due to the capacitive coupling from any neighboring wirings of the amplitude of the signal voltage of $V_{DD}$ of the first wiring 1 and wiring 4. This can be because the small amplitude of the signal voltage of wiring's sectional area at the first wiring 1 and the wiring 4 is small. As a result, it is possible to maintain crosstalk extremely small in a way proportional to the wiring's sectional area, when compared to the case where wirings are formed in parallel to have increased lengths.

Figure 6:
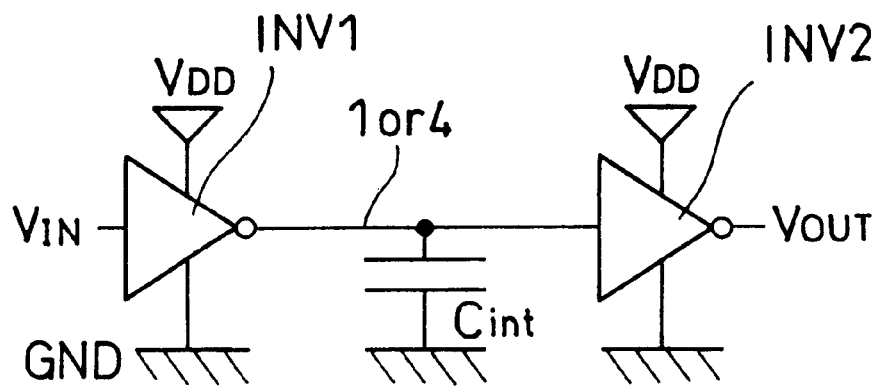
FIG. 6 is a diagram showing a configuration of a driver circuit for driving the local wiring of the present invention.

Referring next to FIG. 6, there is shown an example of a wiring driving circuit with an amplitude of the signal voltage of $V_{DD}$ and wiring driving circuits with a small amplitude of the signal voltage. Several exemplary the circuits with the small amplitude of the signal each used to drive the global wirings of the present invention are depicted in FIG. 7 through FIG. 12.

In FIGS. 6 to 12, inverters INV1 up to INV11 indicate CMOS inverters with a power supply voltage of $V_{DD}$, by way of example. NAND1 to NAND2 and NOR1 to NOR2 designate NAND circuits and NOR circuits each having the power supply voltage of $V_{DD}$, for example. Here, "Cint" denotes a wiring capacitance. Specific portions with Cint connected thereto are for use as wirings, with reference characters corresponding to the wirings 1, 2, 3, 4 being added thereto.

In FIG. 6, an output of the CMOS inverter INV1 serving as a wiring driver is connected to one end of the first wiring 1 or the wiring 4 having the capacitance of Cint; the other end of such wiring is connected to an input of the inverter INV2 for use as a wiring receiver. These permits an input voltage of $V_{IN}$ to be output to $V_{OUT}$ via the first wiring 1 or the wiring 4.

With the present invention, the $V_{DD}$ wiring driver circuit of FIG. 6 is useable for driving the first wiring 1 or the wiring 4 which is the local wiring, and no changes or alterations from the wiring driver circuit of CMOS circuitry are required.

Figure 7:
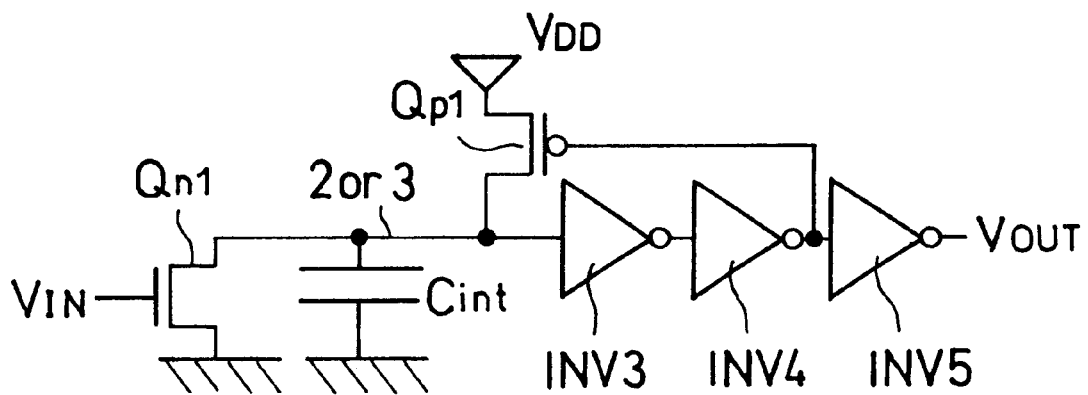
FIG. 7 is a diagram depicting a configuration of a drive circuit with a small amplitude of a signal voltage of the global wiring of the present invention.

In addition, the second wiring 2 and third wiring 3 for use as the global wirings may be designed to employ a circuit of a small amplitude of the signal voltage shown in FIG. 7, for example. FIG. 7 depicts a so-called static sense amplifier circuit, which has been recited for example in "Circuits, Interconnections, and Packaging for VLSI,"H. Bakoglu, translated by Kisaburou Nakazawa under supervision of Hiroshi Nakamura, Mar. 30, 1995, Maruzen Co. Ltd., pp. 184–198.

In this circuit an n-type MISFET Qn1 is as a wiring driver whereas a p-type MISFET Qp1 and inverters INV3, INV4, INV5 constitute a wiring receiver.

While the n-type MISFET Qn1 turns off, more than one wiring of the wirings 2 is charged up by the p-type MISFET Qp1. When it becomes slightly higher than a logic inversion voltage of the inverter INV3, Qp1 turns off causing such chargeup to stop. Thus, the wiring 2's voltage stays at a certain value less than $V_{DD}$. Alternatively, when the n-type MISFET Qn1 turns on, the wiring 2's voltage is clamped at a specific potential level that is determinable by a channel resistance ratio of n-type MISFET Qp1 versus p-type MISFET Qn1 , and will hardly behave to drop down to 0V.

From the foregoing, it is possible to set the amplitude of signal voltage of second wiring 2 at $V_1$, which is less than $V_{DD}$. This makes it possible to reduce electrical power consumption used for chargeup of the second wiring 2 to $(V_1/V_{DD})^2$ times.

Here, this circuit is capable of suppressing the second wiring 2's voltage so that it is higher than 0V and yet lower than $V_{DD}$, irrespective of the fact that only the $V_{DD}$ is used as the power supply voltage thereof. In the circuit of FIG. 6 having the amplitude of the signal voltage of $V_{DD}$, the n-type MISFET forming the first stage inverter INV2 of the wiring receiver does not turn on when an input voltage of the inverter INV2 is less in potential than or equal to Vthn; the p-type MISFET does not turn on when the inverter INV2's input voltage is potentially greater than or equal to ($V_{DD}$–Vthp), where Vthn is the threshold value of n-type MISFET and Vthp is that of p-type MISFETs. Thus an output voltage will hardly change in potential within these voltage ranges even upon occurrence of an input voltage change. This would result in creation of an output delay with respect to an input signal.

Due to this, in FIG. 7, if transistor widths of these Qn1 and Qp1 are appropriately adjusted to let a voltage range of the second wiring 2 be greater than or equal to the threshold value Vthn of n-type MISFET forming the inverter INV3 while letting it be less than or equal to ($V_{DD}$–Vthp) where Vthp is the threshold value of p-type MISFET forming the inverter INV3, it is possible to reduce an input/output delay otherwise occurring due to the presence of an insensitive or "dead" zone as created in the inverters of FIG. 6 due to transistor threshold values, thus enabling achievement of high-speed operations. Actually, design activity was done to establish an amplitude of the signal voltage of $0.4V_{DD}$ in a circuit of FIG. 7, for investigation of a delay time of $V_{IN}$ and $V_{OUT}$. Letting the transistor threshold value be $0.2V_{DD}$, wiring driver's final-stage transistor resistance be R, and delay time of an inverter of F/O=1 be $\tau_0$, 50%-delay time from $V_{IN}$ to $V_{OUT}$ is obtained as $0.5 \times Cint \times R + 3 \times \tau_0$ or less. Thus, it has been found that high-speed performance is achievable in a region in which the wiring capacitance Cint has greater controlling effects than the 50%-delay time $0.7 \times Cint \times R$ in the case of driving the wiring 2 by the CMOS inverter of FIG. 6.

In case the second wiring layer 2 is driven by the circuit of FIG. 7, it is possible to reduce power consumed upon chargeup and discharging of wirings to 16% of the CMOS inverter of FIG. 6. Furthermore, an elongated wiring for signal transmission may be a single line as in the case of the FIG. 6 circuit, with no increases in wiring number at the global wirings. Obviously, since the power supply voltage may be $V_{DD}$ alone, any new power supply voltage lines are unnecessary.

In particular, with the receivers shown in FIGS. 7–11, any input voltage range of dead zone is absent which is caused by the threshold values $V_{thn}$ and $V_{thp}$ of receiver transistors as in the receiver shown in FIG. 6. Hence, the wiring delay no longer increase even when the amplitude of the signal voltage of the second wiring 2 is made smaller by a degree corresponding this dead zone. Here, in order to reduce a subthreshold leakage current in the receiver using the CMOS inverter of FIG. 6, it is desirable that the individual one of $V_{thn}$ and $V_{thp}$ be greater than or equal to $0.15 \times V_{DD}$. It is thus possible to establish the relation of $V_1 \leq V_{DD} - V_{thp} - V_{thn} \leq 0.7 \times V_{DD}$ without increasing the wiring delay, thereby making it possible to lessen the power being consumed in wiring chargeup and discharging events. In other words, this may be realized by use of a structure of $H_1 \geq (V_{DD}/V_1)^{1.5} \times H_2 \geq 1.7 \times H_2$.

Figure 8:
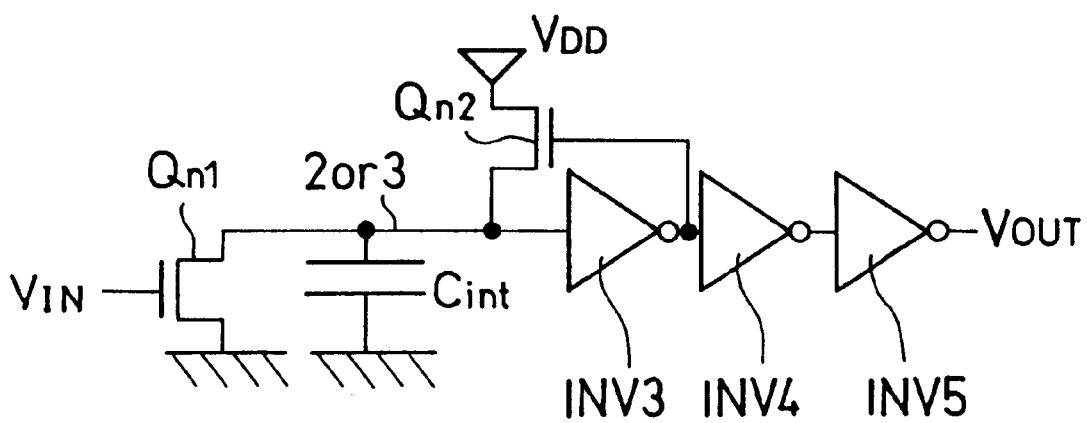
FIG. 8 is a diagram showing a configuration of a drive circuit with a small amplitude of a signal voltage of the global wiring of the present invention.

A driver circuit shown in FIG. 8 is an example with an n-type MISFET Qn2 in place of Qp1, wherein Qn1 and Qn2 are transistors of the same conductivity type. This facilitates achievement of any intended matching.

Figure 9:
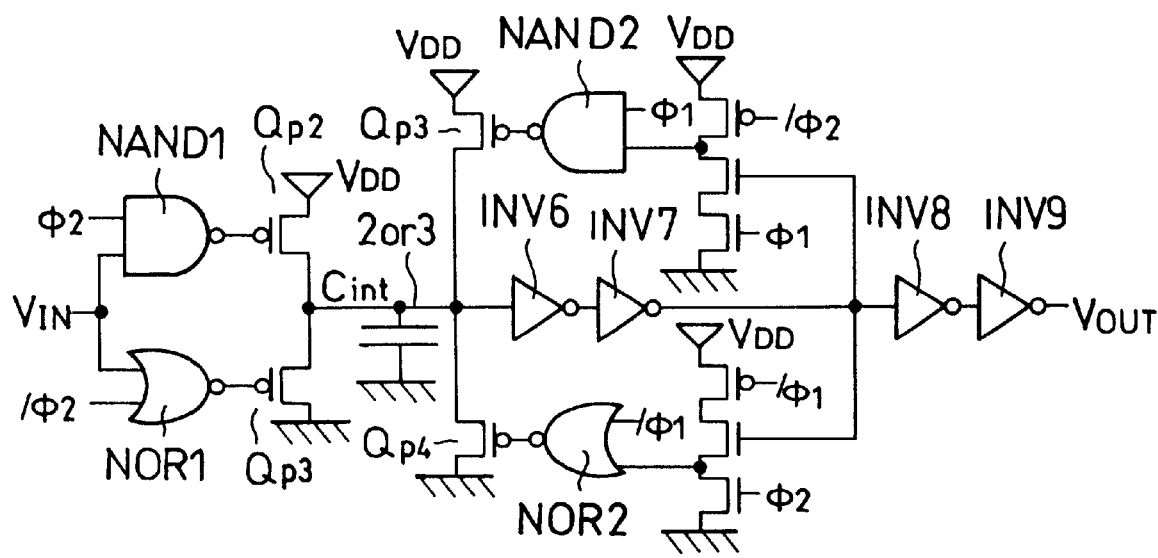
FIG. 9 is a diagram showing a configuration of a drive circuit with a small amplitude of a signal voltage of the global wiring of the present invention.

A driver circuit shown in FIG. 9 is a so-called $V_{DD}/2$-precharge circuit, wherein part on the left side than the second wiring 2 or the third wiring 3 is a driver for the second wiring 2 or the third wiring 3. Additionally, part on the right side than the second wiring 2 or the third wiring 3 is a receiver for onchip interconnect wirings. A voltage of the second wiring 2 or third wiring 3 operates with an amplitude of the signal voltage less than $V_{DD}$ and with $V_{DD}/2$ being as a center.

Figure 13:
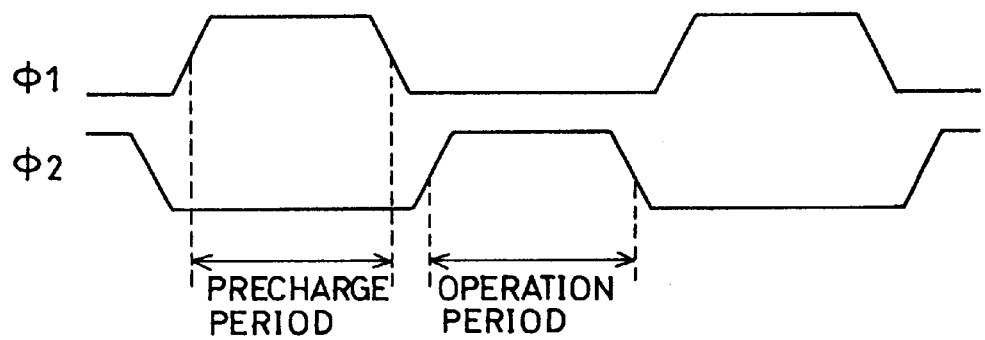
FIG. 13 is a diagram showing a relation of clock signal voltages to drive the semiconductor device of the present invention.

Note here that Φ1 and Φ2 are two-phase clocks with no overlaps as shown in FIG. 13. When Φ1 goes high in potential, a precharge period is established for charging up a wiring at a level of substantially $V_{DD}/2$. When Φ2 potentially goes high, signal transmission is performed. With such an arrangement, it is possible to reduce or eliminate flow of a DC current that has been present when the transistor Qn1 is rendered conductive in the circuit of FIG. 8.

Figure 10:
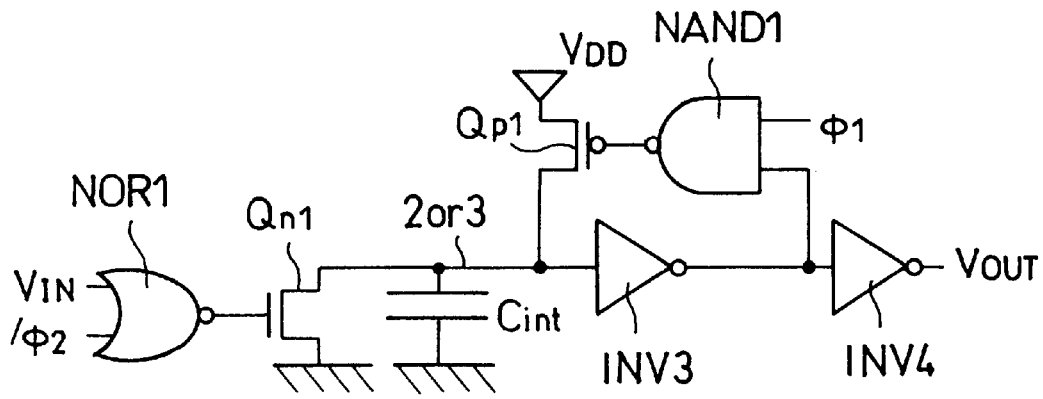
FIG. 10 is a diagram showing a configuration of a drive circuit with a small amplitude of a signal voltage of the global wiring of the present invention.
Figure 11:
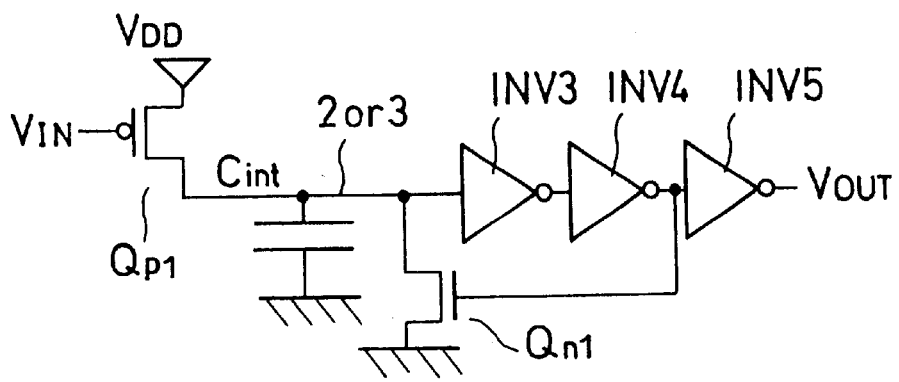
FIG. 11 is a diagram showing a configuration of a drive circuit with a small amplitude of a signal voltage of the global wiring of the present invention.

A circuit shown in FIG. 10 is a clock-added sense amplifier which is similar to the static sense amplifier of FIG. 7 with a clock being added thereto. With this circuit also, it is possible to reduce DC current that was present when the transistor Qn1 is in the conductive state.

These circuits shown in FIGS. 9 and 10 require use of wirings for input of external clocks Φ1 and Φ2. In addition, in the case where a HIGH period for $V_{IN}$ input is long resulting in that wiring power consumption due to turn-on of the transistor Qn1 of the circuit of FIG. 7 is problematic, a circuit of the type that is complementary to that of FIG. 7 may be used as in a circuit shown in FIG. 11.

As apparent from the foregoing, when using the circuits of the small amplitude of the signal voltage shown in FIGS. 7 to 11 to drive global wirings, it is possible to shorten a wiring delay time without the need for any increase in wiring number. This can be the because the long wiring for signal transmission is only a single wiring as in the case of using the driver circuit of FIG. 6. Further, since the power supply voltage required may be $V_{DD}$ alone, any new power supply lines are not necessary. Furthermore, an increase in circuit area is less then two times that in the case of using the driver circuit of FIG. 6 for the global wirings.

Figure 12:
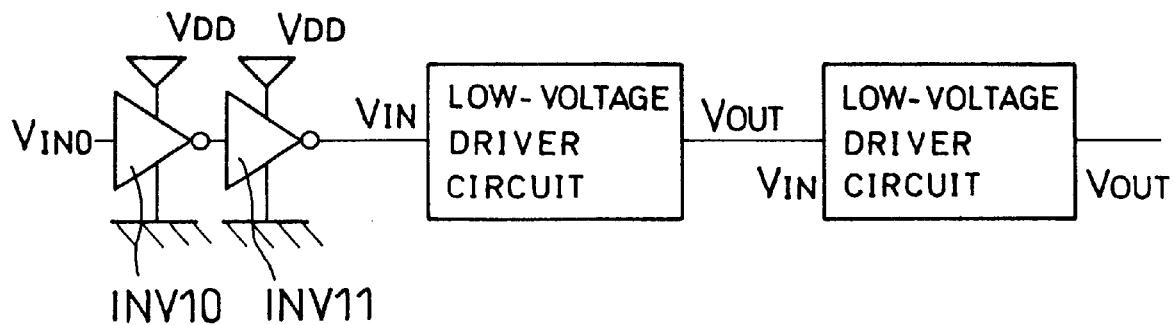
FIG. 12 is a diagram showing a configuration of a drive circuit with a small amplitude of signal voltage of the global wiring of the present invention.

Further, as in the driver circuit shown in FIG. 12, subdividing a long wiring into a plurality of portions while letting the circuits of the small amplitude of the signal voltage of FIGS. 7–12 be connected in series permits formation of a repeater of the small amplitude of the signal voltage, thereby making it possible to improve the signal delay. Additionally, in cases where wiring capacitances rather than wiring resistivities are problematic, the delay time can be improved by connection of serially-coupled inverters INV10, INV11 with gradually increased sizes at the prestage of the circuit of the small amplitude of the signal voltage to thereby form a cascade driver. This cascade driver is formable by layout of immediately adjacent transistors while making it possible to form a global wiring as the circuit of the small amplitude of the signal voltage without increasing the requisite number of global wirings of the circuit of the small amplitude of the signal voltage.

The arrangement stated supra offers several important features which follow.

Firstly, it is possible to achieve low-power consumption while simultaneously improving a delay time due to wiring delays, without requiring any addition to the number of wiring layers used. Low-power consumption is attainable due to the fact that an amplitude of signal voltage in the global wiring layer is less than $V_{DD}$. Thus it is possible to reduce consumed power in a ratio of $(Cu \times V_1^2 + Cd \times V_{DD}^2)/(Cu \times V_{DD}^2 + Cd \times V_{DD}^2)$ at the same clock frequency, where $V_1$ is the amplitude thereof, Cu is the total of capacitances of global wirings, and Cd is the sum of a total capacitance of local wirings and a total contact capacitance of transistors plus a gate capacitance. In this case, simultaneously, the wiring delay time also is reduced to 71% in maximum as has been described in detail in conjunction with the driver circuit of FIG. 7. It is thus possible to further reduce circuit skews otherwise occurring due to such wiring delay, which in turn makes it possible to realize circuitry with enhanced high-speed performance and reduced risks of operation failures.

In addition, it is possible to reduce the operation voltage of a global wirings to the extent that it is less in potential than $V_{DD}$ while at the same time allowing a current flowing in switching events to be less than that of CMOS inverters. This makes it possible to further lessen the current density of such global wirings, thus enabling suppression of reliability problems such as electro-migration, interlayer dielectric breakdown, and the like.

Further, it is possible to reduce electromagnetic noises occurring at global wirings, thus making it possible to prevent unwanted power supply voltage deviation and/or sense circuit's malfunction otherwise occurring due to such electromagnetic noises. Obviously, it is possible to improve the reliability otherwise reducible by a decrease in wiring's thermal hysteresis due to heat generation upon chargeup and discharging in the course of achieving low power consumption while attaining thinner power supply wirings and reducing power supply line areas and also making smaller the junction leakage of transistors involved, which in turn makes it possible to realize higher integration with high reliability and low leakage.

In addition, as any additional number of wiring layers are not required, there are no risks as to defect generation such as interlayer connection failures, reliability degradation and large-scale wiring layer layout alterations otherwise occurring due to layer addition, without accompanying any risks as to productivity decrease due to increase in manufacturing process steps.

Simply replacing the wiring driver with the wiring receiver in low voltage circuitry permits direct use, with no modifications, of prior known circuit design schemes and tools—there is no need to perform any "special" designs for adaptation to multi-power supply and/or multi-signal amplitude technologies. In other words, as far as the design process covering up to logical design of traditional circuitry is concerned, any additional modifications are not necessary. Even in a layout design level, designing in a procedure as will be shown in FIG. 14 makes it possible to implement through a mere change of a model of the wiring delay time without requiring any significant layout alterations while permitting use of computer-aided design (CAD) tools.

Figure 14:
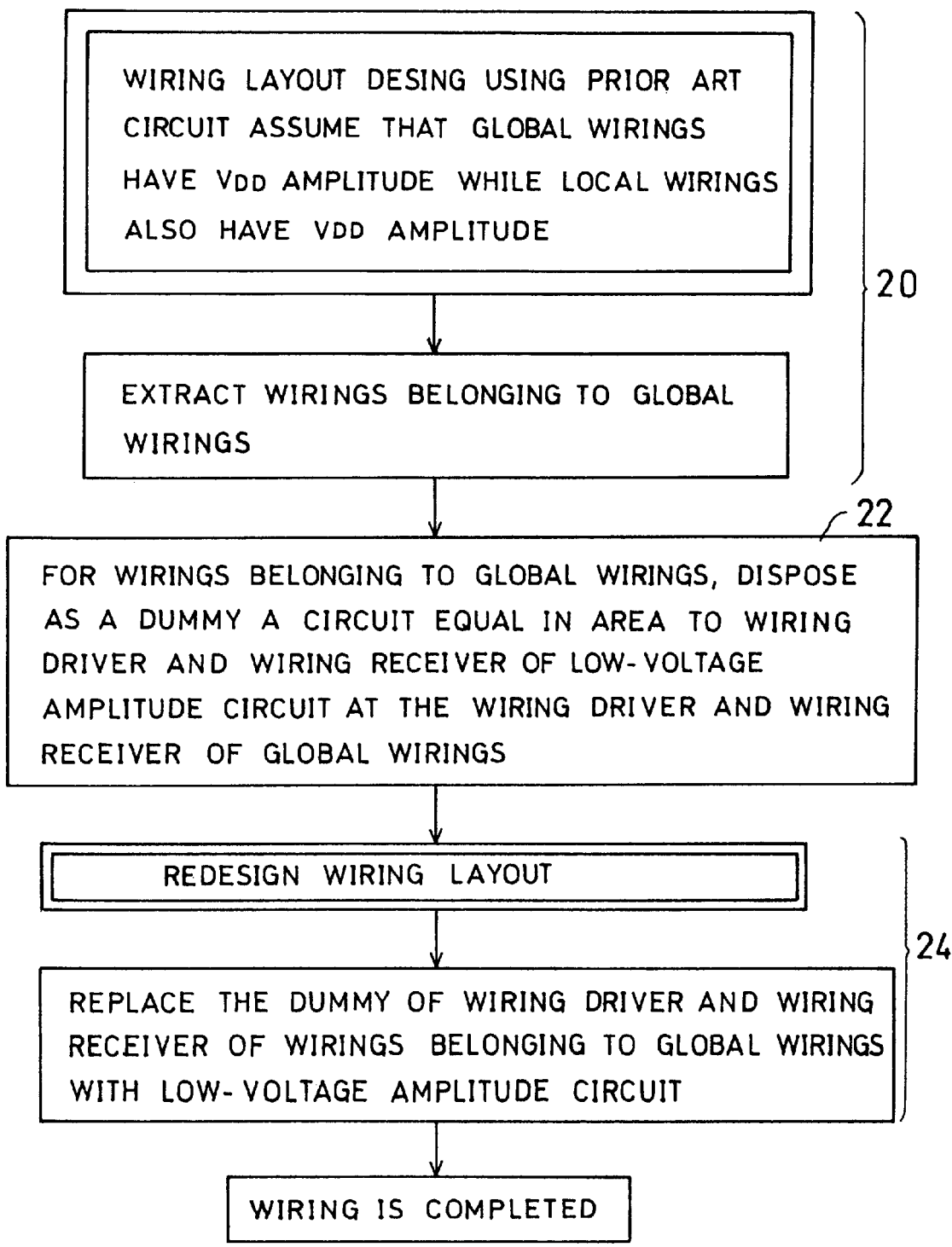
FIG. 14 is a flow chart for explanation of a method for designing the semiconductor device of the present invention.

FIG. 14 shows a scheme for realizing the circuit wiring of the embodiment while directly using, with no changes, a traditional layout design tool. Firstly, as indicated by reference numeral 20, design the layout of a circuit using the voltage $V_{DD}$ to all wiring layers involved, without distinguishing between global wirings and local wirings.

To this end, first select a global wiring, and then determine certain wirings assigned to the global wiring selected. Next, use a CAD tool to extract the wirings that belong to the global wirings. Here, any wiring drivers and receivers for use at the global wirings may be formed of neighboring elements respectively; electrical interconnection within such wiring drivers and receivers is achievable by exclusive use of one or more local wiring layers.

In addition, in case a local wiring has a multilayered wiring structure, an area increase of the wiring drivers and receivers with the small amplitude of the signal voltage is less than or equal to two times that of CMOS inverter drivers and receivers. Thus, achievement can be done with $500F^2$ or less, where F is the design rule.

Additionally, in the situation that multilayer wirings with a chip operation speed limited by wiring delay are fabricated, a minimal area determinable by the minimum transistor size becomes smaller than a chip area determined by such wirings, resulting in some extra spaces remaining in the layout of transistors. Hence, in the event that the global wirings as extracted at the step denoted by numeral 20 and a global wirings are assigned to have an optimal layout, it becomes possible, by modifying certain layout near a driver (s) with the small amplitude of the signal voltage of the local wirings without changing the assignment of the global wirings and the local wirings, to speed up the wiring delay.

Next, at step 24 of FIG. 14, replace a dummy circuit disposed at step 22 with a wiring driver and a wiring receiver. Thus, the intended layout is completed.

Further, with the static sense amplifier circuits shown in FIGS. 7–8, when the wiring capacitance is at least 100 times greater than the capacitance of an inverter with a fan-out of 1, the resultant circuit area decreases to the extent that it is equal to or less than 0.8 times that of the CMOS inverter circuit shown in FIG. 6. In this case, it is possible to perform wiring layout design using the wiring driver and wiring receiver thus formed in the CMOS circuit of FIG. 6 and thus replace the wiring driver and the wiring receiver connected to the global wirings with the subject static sense amplifier without requiring any additional layout alterations to the remaining wiring structures, which in turn makes it possible to readily formulate all the design process steps into a fully automated system. Obviously, implementation of the optimization shown in FIG. 14 makes it possible to reduce or shrink the resulting circuit area when compared to the case of using the wiring driver and the wiring receiver each formed of a CMOS circuit. In this case, the global wiring layer's lithography conditions and masks are directly useable with no specific changes; thus, as long as prior art structure processes are established, both high-speed performance and low power consumption are achievable simultaneously at low production costs.

In addition, the present invention is different from the comparative example in that modifications in the lamination direction of wirings are required only for the thickness of an interlayer insulating film between the global wirings and the local wirings, resulting in elimination of any increase in manufacturing process step number. Additionally, at part between the global wiring and part between the local wiring, the wiring width and wiring pitch plus interlayer insulating film thickness may be set at the same values used in the prior art. Thus, it is possible to accomplish any intended scaling while letting all crosstalk voltages occurring from neighboring wirings in up-down and lateral directions be set at $(V_1/V_{DD})$ times. Hence, it is possible to employ, with no changes, the wiring layout in circuitry of the prior art structure which has passed circuit verification tests and process verification tests. This in turn makes it possible to directly employ, without any specific changes, the wiring layout that has already passed circuit-operation/process verify tests in the circuitry with prior art structures.

In addition, the interlayer insulating film thickness between the first wiring 1 and the second wiring 2 is only increased. It is not required to increase the other interlayer insulating film(s). Accordingly, it is possible to reduce or suppress creation of defects otherwise occurring due to film stresses with an increase of the other interlayer films.

Next, in case a circuit with the small amplitude of the signal voltage and a circuit with the amplitude of the signal voltage of $V_{DD}$ are provided in the horizontal direction, a need arises to suppress the amplitude of the signal voltage of the global wirings and its adjacent the local wiring of multilayer wirings of the circuit with the small amplitude of the signal voltage—for example, it is required that a layer of constant voltage such as a power supply layer be inserted therebetween. Fortunately, with this method, such a layer of constant voltage is no longer required; thus, it is possible to widen or maximize the effective wiring area within a chip.

Embodiment 2

Figure 15:
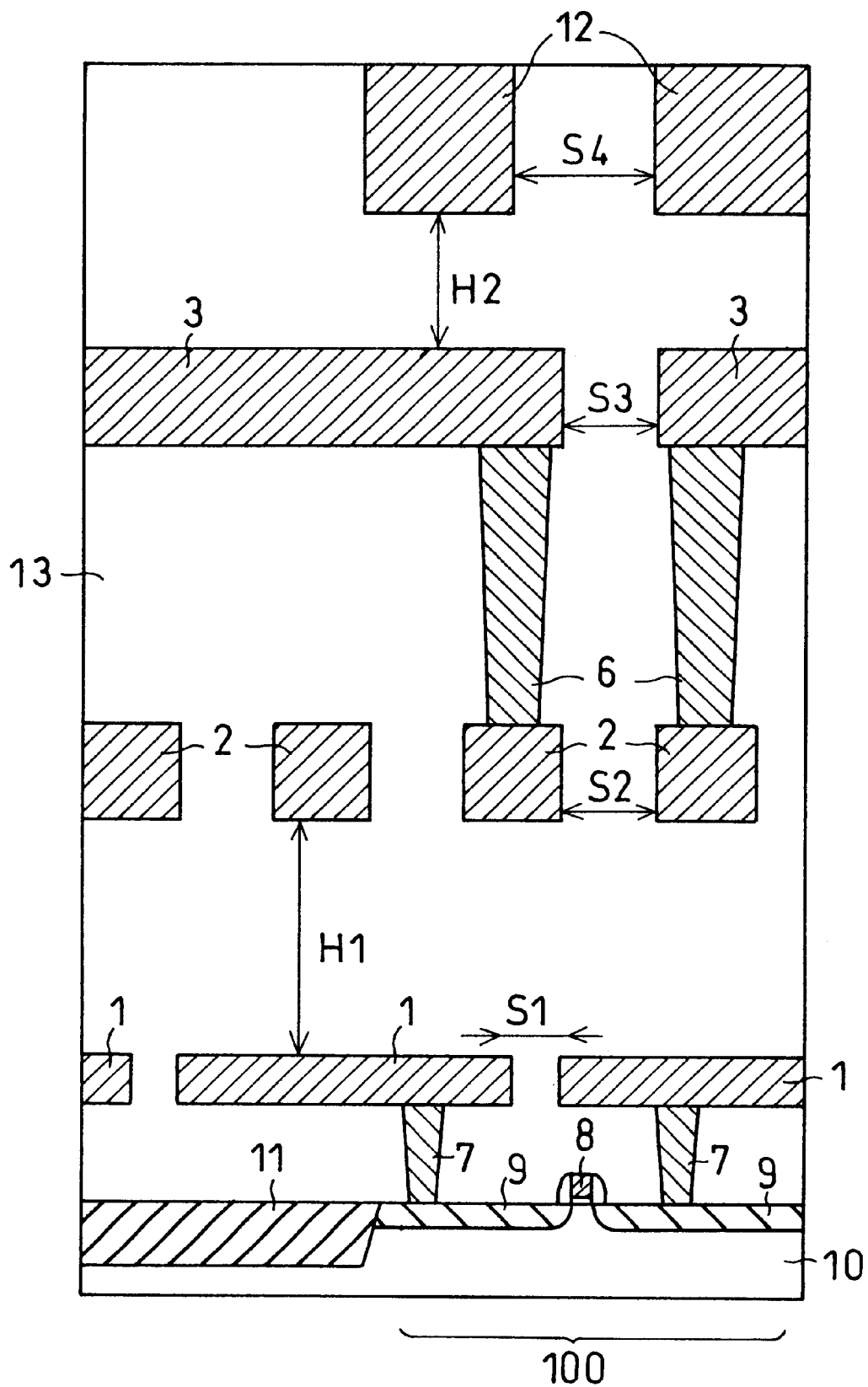
FIG. 15 is a diagram illustrating in cross-section a semiconductor device in accordance with a second embodiment of the present invention.

FIG. 15 is a diagram showing in cross-section a multilayer wiring structure of a semiconductor device in accordance with a second embodiment of the present invention, including a semiconductor substrate region thereof. The same parts or components as those in FIG. 1 are designated by the same reference characters, and an explanation thereof will be eliminated herein.

This embodiment shown is the one that a fourth wiring 12 is further formed over the third wiring 3 in the first embodiment stated supra, wherein a distance H1 between the first wiring 1 and the second wiring layer 2 is greater than a distance H2 between the third wiring 3 and the fourth wiring 12.

In FIG. 15, depiction of the part underlying the second wiring 2 is omitted, as it is the same in structure as that of the first embodiment set forth previously.

An insulating film 13 (a third insulating film) is deposited on an entire upper surface of the second wiring 2 to have a thickness greater in value than H1. Formed therein are contacts 6 for connection between the wirings. Contacts 6 are made for example of W, Ru, Ti, TiN, Cu, Al, or AlCu. The diameter of each wiring contact 6 is greater than or equal to that of wiring contact 5.

Further, the third wiring 3 made for example of W, Cu, Al, or AlCu is formed to overlie the wiring contacts 6. The third wiring 3 has its film thickness that is greater than that of the first wiring 1, for reduction of wiring resistivity per unit area on a lamination surface. Furthermore, a wiring spacing S3 within this third wiring 3 is formed so that it is greater than the wiring spacing S1 within the first wiring 1 for reduction of a capacitance between adjacent ones of the wirings included in the third wiring 3 to thereby lessen a product of wiring resistance and wiring capacitance. The third wiring 3 is used for those wirings between circuit blocks placed farther than the circuit blocks connected using the first wiring 1. The third wiring 3 is greater in wiring length than first wiring 1.

In addition, the third wiring 3 is designed so that its minimum wiring width W3 is greater than the wiring width W1 of the first wiring 1 to thereby reduce wiring resistance. To form random block wirings while improving the integration density, it is desirable that the second wiring 2 and the third wiring 3 are formed to extend in perpendicular directions while having the same wiring thickness and wiring width.

Further, it is desirable in order to reduce crosstalk between wiring layers that the second wiring 2 and that third wiring 3 are formed to extend in the perpendicular directions rather than in parallel directions.

Further, the insulating film 13 is deposited on the entire surface of the third wiring 3 to have a height of H2. Although not specifically shown in the drawing, more than one wiring contact between wiring layers is formed, which is made of W, Ru, Ti, TiN, TaN, Cu, Al, or AlCu. This wiring contact has a diameter that becomes equal to or greater than the diameter of wiring contact 6.

Further, the fourth wiring 12 made for example of W, Cu, Al, or AlCu is formed on the wiring contact. The fourth wiring 12 has its film thickness greater than the film thickness of the first wiring 1 for reduction of the wiring resistivity per unit area on a lamination surface. Further, the wiring spacing S4 within this fourth wiring 12 is formed to be greater than the wiring spacing S1 within the first wiring 1 to thereby suppress a capacitance between wirings included in the fourth wiring 12. The fourth wiring 12 is used for those wirings between circuit blocks placed farther than the first wiring 1. The fourth wiring 12 has a wiring length that becomes longer than the wiring length of the first wiring 1.

Additionally, the minimum wiring width W12 of the fourth wiring 12 becomes greater than the minimum wiring width W1 of the first wiring 1 to thereby reduce the wiring resistivity. For reduction of crosstalk between wiring layers, it is desirable that the fourth wiring 12 and the third wiring 3 are formed in perpendicular directions rather than in parallel directions.

Note here that in the illustrative embodiment, H2 that is one wiring distance of the global wirings gets smaller than the distance H1 between the local wiring and the global wiring. Here, especially, $H1 > (V_{DD}/V_1)^{1.5} \times H^2$ is established, where $V_1$ is the logical amplitude of the second wiring 2, the third wiring 3, and the wiring layer 4. Even with such a structure, it is possible to let crosstalk from the first wiring 1 is less than or equal to $(V_1/V_{DD})$ times, which in turn makes it possible to reduce the amplitude of the signal voltage of the global wirings to $V_1$. Obviously, although not specifically shown in FIG. 15, satisfying the relation of $H1>(V_{DD}/V_1)^{1.5} \times H2$ while letting a minimal value of the interval between neighboring layers at further upper levels in the lamination direction be set at H2 makes it possible to allow all crosstalk components due to the capacitive coupling of the local wirings to stay less than or equal to $(V_1/V_{DD})$ times, thus enabling the amplitude of the signal voltage of the global wirings to drop down at $V_1$.

In this embodiment, since the distance between the second wiring 2 and the third wiring 3 is increased when compared to the first embodiment stated supra, it is possible to further lessen crosstalk between the second wiring 2 and the third wiring 3.

The present invention is such that methods for fabrication of element isolation films and insulating films per se may be replaced with any methods other than the above-noted methods of converting silicon into silicon oxide films or silicon nitride films, including for example a method for doping oxygen ions into silicon deposited and a method for oxidizing the silicon deposited.

In addition, the gate insulating films and interlayer dielectric films 13 may alternatively be formed of SiN films, amorphous carbon films, $TiO_2$ films, alumina films, tantalum oxide films, strontium titanate films, barium titanate films, zirconium titanate-plumbum films, organic dielectric films such as hydrogen silsesquioxane (HSQ) films, methyl-silsesquioxane (MSQ) films, poly-arylene-ether (PAE) films, or polyimide films, or any available lamination films thereof.

In addition, although the p-type Si substrate is used as the semiconductor substrate 10, this may be replaced with an n-type Si substrate, an SOI silicon layer of SOI substrate, or single-crystalline semiconductor substrates containing therein silicon such as SiGe mixed-crystal, SiGeC mixed-crystal or the like.

In addition, the gate electrode 8 may be made of p-type polycrystalline Si, SiGe mixed crystal, metals such as Al, TiN, TaN, Al, Cu or else, or multilayer structures thereof.

In addition, although the example is shown with the trench element isolation 11 being formed therein, the trench element isolation may be replaced with other ones such as for example mesa-etching, LOCOS element isolation, and the like.

Any other parts or components may be modifiable and alterable when reduction to practice without departing from the true spirit and scope of the present invention as defined by the appended claims.

What is claimed is:

1. A semiconductor device comprising:
a semiconductor substrate;
a semiconductor element formed on or over the semiconductor substrate, the semiconductor element substantially covered with a first insulating film;
a first wiring formed on the first insulating film, the first wiring electrically connected to the semiconductor element;
a second wiring formed over the first wiring with a second insulating film laid therebetween; and
a third wiring formed over the second wiring with a third insulating film laid therebetween,
wherein a thickness of the first wiring is less than a thickness of the second wiring and thickness of the third wiring, and
a distance between the first wiring and the second wiring is greater than a distance between the second wiring and the third wiring.

2. A semiconductor device according to claim 1, wherein the second wiring is formed adjacent and next to the first wiring in an up-down direction, and that the third wiring is formed adjacent and next to the second wiring in the up-down direction.

3. A semiconductor device according to claim 1, wherein when the distance between the first wiring and the second wiring is represented by H1 while the distance between the second wiring and the third wiring is H2, these are given as $H1 \geq 1.7 \times H2$.

4. A semiconductor device according to claim 1, wherein a wiring pitch of the adjacent first wirings is less than a wiring pitch of the adjacent second wirings and a wiring pitch of the adjacent third wirings.

5. A semiconductor device according to claim 1, wherein a wiring width of the first wiring is less than a wiring width of the second wiring and a wiring width of the third wiring.

6. A semiconductor device according to claim 1, wherein an amplitude of a signal voltage of the second wirings and an amplitude of a signal voltage of the third wirings are each less than an amplitude of a signal voltage of the first wirings.

7. A semiconductor device according to claim 6, wherein the amplitude of the signal voltage of the first wiring is equal to a difference between a power supply voltage of the semiconductor element $V_{DD}$ and a grand voltage.

8. A semiconductor device according to claim 7, wherein when the amplitude of the signal voltage of the second wiring is $V_1$, the distance between the first wiring and the second wiring is greater than $(V_{DD}/V_1)^{1.5}$ times of the distance between the second wiring and the third wiring.

9. A semiconductor device according to claim 8, wherein the amplitude of the signal voltage of the second wirings is less than or equal to $0.48V_{DD}$.

10. A semiconductor device comprising:
a semiconductor substrate;
a semiconductor element formed on or over the semiconductor substrate, the semiconductor element substantially covered with a first insulating film;
a first wiring formed on the first insulating film, the first wiring electrically connecting to the semiconductor element;
a second wiring formed over the first wiring with a second insulating film laid therebetween;
a third wiring formed over the second wiring with a third insulating film laid therebetween; and
a fourth wiring formed over the third wiring with a fourth insulating film laid therebetween,
wherein a thickness of the first wiring is less than a thickness of the second wiring, the third wiring and the fourth wiring, and
a distance between the first wiring and the second wiring is greater than a distance between the third wiring and the fourth wiring.

11. A semiconductor device according to claim 10, wherein the second wiring is formed adjacent and next to the first wiring in an up-down direction, that the third wiring is formed adjacent and next to the second wiring in the up-down direction, and that the fourth wiring is formed adjacent and next to the third wiring in the up-down direction.

12. A semiconductor device according to claim 10, wherein when the distance between the first wiring and the second wiring is represented by H1 while the distance between the third wiring and the fourth wiring is H2, H1≧1.7×H2 is established.

13. A semiconductor device according to claim 10, wherein a wiring pitch of the adjacent first wirings is less than a wiring pitch of the adjacent second wirings and a wiring pitch of the adjacent third wirings.

14. A semiconductor device according to claim 10, wherein a wiring width of the first wiring is less than a wiring width of the second wiring and a wiring width of the third wiring.

15. A semiconductor device according to claim 10, wherein a wiring pitch of the adjacent first wirings is less than a wiring pitch of the adjacent fourth wirings.

16. A semiconductor device according to claim 10, wherein an amplitude of a signal voltage of the second wirings, an amplitude of a signal voltage of the third wirings and an amplitude of a signal voltage of the fourth wirings are less than an amplitude of a signal voltage of the first wirings.

17. A semiconductor device according to claim 16, wherein the amplitude of the signal voltage of the first wiring is equal to a difference between a power supply voltage of the semiconductor element $V_{DD}$ and a ground voltage.

18. A semiconductor device according to claim 17, wherein when the amplitude of the signal voltage of the second wiring is $V_1$, the distance between the first wiring and the second wiring is greater than $(V_{DD}/V_1)^{1.5}$ times of the distance between the third wiring and the fourth wiring.

19. A semiconductor device according to claim 18, wherein the amplitude of signal voltage of the second wirings is less than or equal to $0.48V_{DD}$.

20. A semiconductor device comprising:

a semiconductor substrate;

a semiconductor element formed on or over the semiconductor substrate, the semiconductor element covered with a first insulating film;

a local wiring formed on the first insulating film, the local wiring electrically connecting to the semiconductor element, the local wiring including a first wiring;

a global wiring formed over the local wiring with a second insulating film laid therebetween, the global wiring electrically connected to the local wiring, the global wiring including a second wiring and a third wiring formed over the second wiring, wherein a thickness of the first wiring is less than a thickness of the second wiring and a thickness of the third wiring, and a distance between the first wiring and the second wiring is greater than a distance between the second wiring and the third wiring.

* * * * *